United States Patent
Tajiri

(10) Patent No.: US 9,219,136 B2
(45) Date of Patent: Dec. 22, 2015

(54) SWITCHING ELEMENT

(71) Applicant: SHARP KABUSHIKI KAISHA, Osaka-shi, Osaka (JP)

(72) Inventor: Masayuki Tajiri, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/425,359

(22) PCT Filed: Sep. 20, 2013

(86) PCT No.: PCT/JP2013/075481
§ 371 (c)(1),
(2) Date: Mar. 3, 2015

(87) PCT Pub. No.: WO2014/050740
PCT Pub. Date: Apr. 3, 2014

(65) Prior Publication Data
US 2015/0228773 A1    Aug. 13, 2015

(30) Foreign Application Priority Data
Sep. 28, 2012  (JP) .................................. 2012-218175

(51) Int. Cl.
*H01L 29/778* (2006.01)
*H01L 29/15* (2006.01)
*H01L 29/20* (2006.01)

(52) U.S. Cl.
CPC .......... *H01L 29/7787* (2013.01); *H01L 29/155* (2013.01); *H01L 29/2003* (2013.01)

(58) Field of Classification Search
CPC ............ H01L 29/7787; H01L 29/2003; H01L 29/66462
See application file for complete search history.

(56) References Cited

U.S. PATENT DOCUMENTS

| | | | | |
|---|---|---|---|---|
| 2008/0303064 A1* | 12/2008 | Sato | .............................. | 257/194 |
| 2009/0008676 A1* | 1/2009 | Sato | .............................. | 257/194 |
| 2013/0214283 A1* | 8/2013 | Briere et al. | ..................... | 257/76 |
| 2013/0320349 A1* | 12/2013 | Saunier et al. | .................. | 257/76 |
| 2014/0203329 A1* | 7/2014 | Saitoh et al. | .................. | 257/194 |

FOREIGN PATENT DOCUMENTS

| | | |
|---|---|---|
| JP | 2007-317794 | 12/2007 |
| JP | 2009-88081 | 4/2009 |

OTHER PUBLICATIONS

International Search Report for PCT/JP2013/075481 mailed Dec. 3, 2013, four pages.

* cited by examiner

*Primary Examiner* — Nikolay Yushin
(74) *Attorney, Agent, or Firm* — Nixon & Vanderhye, P.C.

(57) ABSTRACT

Provided is a switching element that is hardly destroyed even under a high bias condition in an off state because an electric field near a gate electrode is relaxed. A switching element 1 includes a carrier transit layer 13, a carrier supply layer 14 formed on an upper surface of the carrier transit layer 13, having a wider bandgap than the carrier transit layer 13, and forming a heterojunction with the carrier transit layer 13, a source electrode 15, a drain electrode 16, and a gate electrode 17 arranged between the source electrode 15 and the drain electrode 16. An impurity-doped layer 20 is interposed between the carrier transit layer 13 and the drain electrode 16. The impurity-doped layer 20 is formed as a semiconductor layer by heavily doping an impurity having the same conductivity type as a carrier constituting a two-dimensional carrier gas layer 18 generated due to the heterojunction, and a depletion layer 23b is formed in the impurity-doped layer 20 when the switching element 1 is in the off state, and thereby a high electric field generated near the gate electrode 17 is dispersed.

4 Claims, 13 Drawing Sheets

SWITCHING ELEMENT

CROSS-REFERENCE TO RELATED APPLICATIONS

This application is a National Phase filing under 35 U.S.C. §371 of International Application No. PCT/JP2013/075481 filed on Sep. 20, 2013, and which claims priority to Japanese Patent Application No. 2012-218175 filed on Sep. 28, 2012, the entire contents of which are hereby incorporated by reference.

TECHNICAL FIELD

The present invention relates to a switching element represented by a high electron mobility transistor (HEMT) and the like.

BACKGROUND ART

Recently, a nitride semiconductor as a group III-V compound semiconductor represented by gallium nitride (GaN) is expected to be applied to the switching element. This is because the nitride semiconductor has characteristics suitable for a power device, that is, its bandgap is as wide as 3.4 eV, its dielectric breakdown field is 10 times higher, and its electron saturation speed is 2.5 times higher than a conventional silicon (Si) semiconductor.

For example, a switching element having a hetero structure of GaN/AlGaN formed on a substrate of silicon carbide (SiC) or sapphire is proposed. According to this switching element, a two-dimensional electron gas layer having a high concentration of $1\times10^{13}$ cm$^{-2}$ is generated in an interface of GaN/AlGaN due to polarization by a piezo effect caused by lattice mismatch of AlGaN and GaN, in addition to spontaneous polarization caused by an asymmetric structure in a c-axis direction of a crystal structure (wurtzite structure) of GaN. To be used as the switching element, its states are to be switched between a state (on state) in which predetermined electrodes are electrically connected, and a state (off state) in which the predetermined electrodes are not electrically connected, by controlling the electron density of the two-dimensional electron gas layer.

FIG. 11 is a cross-sectional view illustrating a structure of the above switching element.

A conventional switching element 100 illustrated in FIG. 11 includes a substrate 101, a buffer layer 102 formed on an upper surface of the substrate 101, a carrier transit layer 103 (carrier channel layer) composed of undoped GaN, formed on an upper surface of the buffer layer 102, a carrier supply layer 104 composed of AlGaN, formed on an upper surface of the carrier transit layer 103, a source electrode 105 and a drain electrode 106 formed on an upper surface of the carrier supply layer 104, and a gate electrode 107 formed on the upper surface of the carrier supply layer 104 and formed between the source electrode 105 and the drain electrode 106.

Furthermore, a gate insulating film 110 is provided between the gate electrode 107 and the carrier supply layer 104 to suppress a gate leakage current.

The switching element 100 is a normally-on type element, so that even when a potential of the gate electrode 107 is the same (0 V) as that of the source electrode 105, or even when an open state is provided so that a voltage is not applied to the gate electrode 107, a two-dimensional electron gas layer 108 is generated in an interface of the carrier transit layer 103 with the carrier supply layer 104, and an on state is provided. When the potential of the drain electrode 106 is set higher than the potential of the source electrode 105, a current flows between the drain electrode 106 and the source electrode 105.

Meanwhile, when the potential of the gate electrode 107 is set to be a negative potential lower than a threshold voltage relative to the potential of the source electrode 105, the two-dimensional electron gas layer 108 is not generated in the interface of the carrier transit layer 103 with the carrier supply layer 104 under the gate electrode 107, and an off state is provided. In this state, a current does not flow between the drain electrode 106 and the source electrode 105.

FIG. 12 is a cross-sectional view schematically illustrating an essential portion of the switching element 100 in the off state. When the switching element 100 becomes the off state, as illustrated in FIG. 12, a depletion region 111 is formed under the gate electrode 107. At this time, as for the switching element 100 for the power device, a high potential difference (such as several 100 V corresponding to a power supply voltage) is generated between the drain electrode 106 and the source electrode 105. Consequently, a high electric field 112 is generated in the depletion region 111 on a side close to the drain electrode 106 under the gate electrode 107, and the element could be destroyed in the worst case.

In order to solve the above problem, there is a generally known method for relaxing the electric field generated under the gate electrode 107 on the side close to the drain electrode 106 by forming a structure in which the gate electrode 107 projects at least toward the drain electrode (field plate structure).

As illustrated in FIG. 13, a switching element 200 includes a substrate 201, a buffer layer 202 formed on an upper surface of the substrate 201, a carrier transit layer 203 composed of undoped GaN formed on an upper surface of the buffer layer 202, a carrier supply layer 204 composed of AlGaN formed on an upper surface of the carrier transit layer 203, a source electrode 205 and a drain electrode 206 formed on an upper surface of the carrier supply layer 204, a gate electrode 207 formed on the upper surface of the carrier supply layer 204, and formed between the source electrode 205 and the drain electrode 206 when viewed from a direction perpendicular to the substrate 201, and a gate insulating film 210 on a lower surface of the gate electrode 207 when needed. The gate electrode 207 is configured to project on a passivation layer (insulating layer) 209 formed on the upper surface of the carrier supply layer 204 at least toward the drain electrode 206.

However, even when the gate electrode employs the field plate structure, it is difficult to sufficiently relax a high electric field 212 generated near the gate electrode 207 when several hundred volts are applied between the source and drain electrodes. As a result, when the switching element 200 is kept in the off state for a long time such as several hundred hours while the high voltage is kept applied between the source and drain electrodes, the element is destroyed in the worst case because it is subjected to the high electric field for a long time.

As a method for relaxing the electric field near the gate electrode in the off state, similarly to a GaN MOSFET described in Patent Document 1, a reduced surface field (RE-SURF) region can be provided by doping an impurity in the carrier transit layer. In the off state, the electric field intensively applied to the gate electrode can be dispersed and applied to the RESURF region, so that a field effect transistor is considered to be improved in withstanding voltage.

PRIOR ART DOCUMENT

Patent Document

Patent Document 1: Japanese Patent Application Laid-Open Publication NO. 2009-88081

SUMMARY OF THE INVENTION

Problems to be Solved by the Invention

However, the RESURF region is formed over a wide range from a portion under an end of the gate electrode on a side close to the drain electrode until an N+ contact region on the drain electrode side, and in addition, heavily doped so that its sheet carrier concentration is as relatively high as $1\times10^{12}$ $cm^{-2}$ to $5\times10^{13}$ $cm^{-2}$. Therefore, mobility is considerably reduced due to impurity scattering in the carrier transit layer, particularly in the two-dimensional electron gas layer. As a result, there is a possibility that a sufficient amount of drain current cannot be obtained in the on state.

In view of the above problem, an object of the present invention is to provide a switching element that is not likely to be destroyed even when a high voltage is applied to the element in an off state, and can obtain a sufficient amount of drain current in an on state.

Means for Solving the Problem

In order to achieve the above objects, a first aspect of the present invention is a switching element comprising:

a first semiconductor layer;

a second semiconductor layer formed on an upper surface of the first semiconductor layer, having a wider bandgap than the first semiconductor layer, and forming a heterojunction with the first semiconductor layer;

a first electrode electrically connected to the first semiconductor layer;

a second electrode electrically connected to the first semiconductor layer, and formed to be away from the first electrode in a direction parallel to a surface of the first semiconductor layer; and a control electrode formed on an upper layer of the second semiconductor layer to be located between the first electrode and the second electrode when viewed from a direction perpendicular to the surface, wherein the switching element switches its state according to a potential of the control electrode, between an on state to electrically connect the first electrode to the second electrode through a two-dimensional carrier gas layer generated in a junction interface between the first semiconductor layer and the second semiconductor layer, and an off state to cut off an electrical connection between the first electrode and the second electrode because the two-dimensional carrier gas layer is not generated at least in the junction interface between the first semiconductor layer and the second semiconductor layer under the control electrode, a third semiconductor layer is formed in a predetermined first region on or above the upper surface of the first semiconductor layer by doping an impurity having the same conductivity type as a carrier constituting the two-dimensional carrier gas layer, and the second electrode is electrically connected to the first semiconductor layer through the third semiconductor layer.

In the switching element according to the first aspect, a second aspect is provided in which when a voltage is applied between the second electrode and the first electrode in the off state, majority carriers in the third semiconductor layer moves toward an interface with the second electrode so that majority carriers near an interface with the first semiconductor layer are depleted, and a high-resistance region is formed in the third semiconductor layer.

In the switching element according to the first or second aspect, a third aspect is provided in which the third semiconductor layer is formed on a recessed portion of the first semiconductor layer, and a side surface of the third semiconductor layer is in contact with the two-dimensional carrier gas layer.

In the switching element according to the third aspect, a fourth aspect is provided in which a fourth semiconductor layer having a wider bandgap than the first semiconductor layer is provided between a lower surface of the third semiconductor layer and the upper surface of the first semiconductor layer.

In the switching element according to the first to fourth aspects, preferably, the third semiconductor layer is formed in a second region provided away from the first region on or above the upper surface of the first semiconductor layer to be provided separately from the third semiconductor layer formed in the first region, and the first electrode is electrically connected to the first semiconductor layer through the third semiconductor layer formed on the second region.

In the switching element according to any one of the first to fourth aspects, a fifth aspect is provided in which the second electrode is formed on a part of a region of the third semiconductor layer when viewed from the direction perpendicular to the surface.

As for the switching element according to any of the first to fifth aspects, as sixth aspect, the third semiconductor layer is a low-resistance n-type semiconductor layer with a high doping concentration, and the two-dimensional carrier gas layer is a two-dimensional electron gas.

As for the switching element according to the sixth aspect, it is preferable that each of the first semiconductor layer, the second semiconductor layer, and the third semiconductor layer is composed of a nitride semiconductor, and the third semiconductor layer contains at least one of elements such as C, Si, Ge, Sn, Te, O, and Se, as an impurity.

As for the switching element according to the sixth aspect, it is preferable that the first semiconductor layer is composed of $In_XGa_{1-X}N$ ($0 \leq X \leq 1$), the second semiconductor layer is composed of $In_YAl_ZGa_{1-Y-Z}N$ ($0 \leq Y \leq 1$, and $0 < Z \leq 1$), and the third semiconductor layer is composed of $In_UAl_VGa_{1-U-V}N$ ($0 \leq U \leq 1$, and $0 \leq V \leq 1$) doped with an impurity.

Effects of the Invention

The switching element according to any of the first to sixth aspects is a switching element having a HEMT structure in which the on/off between the first electrode (source) and the second electrode (drain) is controlled by the two-dimensional carrier gas layer formed in the junction interface of the first semiconductor layer (carrier transit layer) and the second semiconductor layer (carrier supply layer), wherein the impurity-doped third semiconductor layer is interposed between the first semiconductor layer and the second electrode.

When the potential of the second electrode rises while the switching element is in the off state, carriers in the two-dimensional carrier gas layer are moved into the third semiconductor layer, and majority carriers in the third semiconductor layer under the second electrode are drawn toward an upper portion close to the second electrode. However, the two-dimensional carrier gas layer is cut due to the depletion caused by the control electrode, so that the carriers are hardly supplied from the first electrode to the third semiconductor layer. Therefore, in the third semiconductor layer, the majority carriers are accumulated in the upper portion while the majority carriers are depleted and resistance becomes high in the lower portion. As a result, the high-resistance depletion region is provided between the two-dimensional carrier gas layer and the second electrode.

When the electric field is dispersed to the depletion region in the third semiconductor layer, the electric field near the control electrode (gate) can be relaxed, so that the switching element is not likely to be destroyed.

Meanwhile, when the switching element is in the on state, a high voltage is not applied to the switching element, and the potential of the second electrode is less likely to rise, so that the majority carriers in the third semiconductor layer are not drawn toward the upper portion near the second electrode. As a result, the high-resistance depletion region is not generated between the two-dimensional carrier gas layer and the second electrode, so that the on resistance of the switching element can be kept low, and the sufficient amount of drain current can be obtained.

Furthermore, even when the potential of the second electrode temporarily rises for some reasons in the on state, the carriers are supplied from the first electrode to the third semiconductor layer through the two-dimensional carrier gas layer, so that the depletion region is not generated in the third semiconductor layer.

That is, according to the present invention, the high-resistance depletion region is generated in the third semiconductor layer and the electric field near the control electrode can be dispersed thereto only when the switching element is in the off state, so that it is possible to realize both high withstanding voltage in the off state, and low on-resistance in the on state.

As described above, according to the present invention, the impurity-doped third semiconductor layer is provided between the first semiconductor layer and the second electrode, so that the switching element is hardly destroyed even when the high voltage is applied to the element in the off state, and can obtain the sufficient amount of drain current in the on state.

DESCRIPTION OF EMBODIMENTS

Hereinafter, embodiments of a switching element according to the present invention will be described with reference to the drawings. In addition, each embodiment of the switching element that will be described below is only one of the embodiments of the present invention, and the present invention is not limited to the following embodiments. Furthermore, the switching elements according to the following embodiments may be partially or entirely combined and used as long as they are compatible.

First Embodiment

Figure 1:
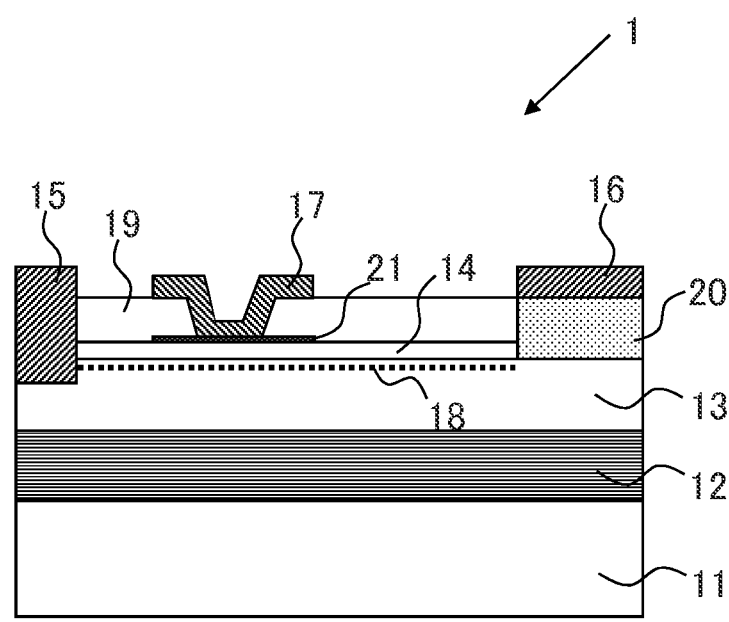
FIG. 1 is a structure cross-sectional view illustrating a configuration of a switching element according to a first embodiment of the present invention.
Figure 2:
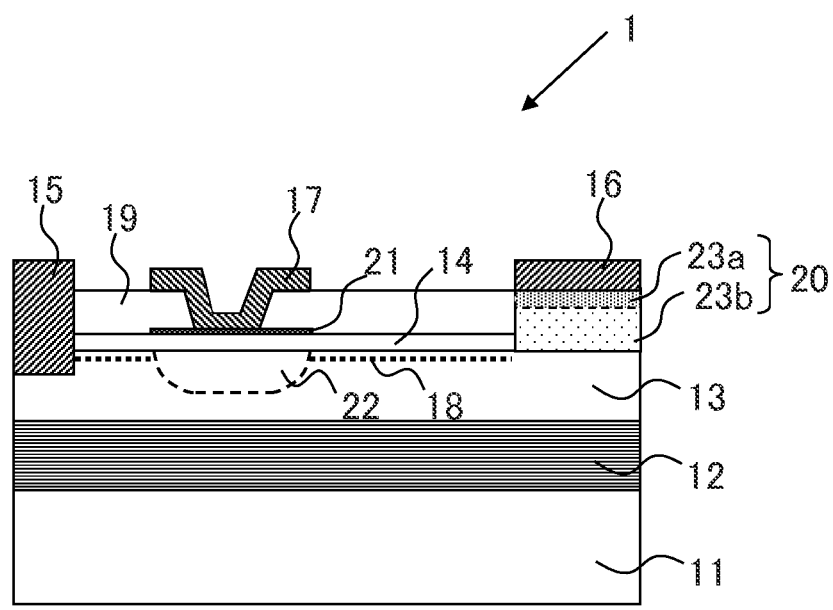
FIG. 2 is a structure cross-sectional view illustrating a configuration of a switching element according to a first embodiment of the present invention.

FIGS. 1 and 2 each illustrate a configuration example of a switching element 1 according to one embodiment of the present invention (hereinafter, referred to as the element 1 of the present invention occasionally). FIGS. 1 and 2 are structure cross-sectional views of the element 1 of the present invention taken from a direction perpendicular to a substrate. FIG. 1 schematically illustrates an on state, and FIG. 2 schematically illustrates an off state of the element 1 of the present invention, respectively. Furthermore, in the following drawings used for describing the embodiments, the same component is marked with the same symbol, and since its name and function are also the same, the same description is not repeated. In addition, in the cross-sectional views in FIGS. 1 and 2, an essential portion is emphasized occasionally, so that a dimensional ratio of each component in the drawing does not always coincide with an actual dimensional ratio. This is the same in the following cross-sectional views.

As illustrated in FIGS. 1 and 2, the element 1 of the present invention includes a substrate 11, a buffer layer 12 formed on an upper surface of the substrate 11, a carrier transit layer (first semiconductor layer) 13 formed on an upper surface of the buffer layer 12, a carrier supply layer (second semiconductor layer) 14 formed on an upper surface of the carrier transit layer 13, a source electrode (first electrode) 15 electrically connected to the carrier transit layer 13, a drain electrode (second electrode) 16 electrically connected to the carrier transit layer 13, and formed to be away from the source electrode 15 in a direction parallel to a surface of the carrier transit layer 13, a gate electrode (control electrode) 17 arranged between the source electrode 15 and the drain electrode 16 when viewed from a direction perpendicular to the surface of the carrier transit layer 13, a passivation layer 19 formed on an upper surface of the carrier supply layer 14 to fill spaces provided between the source electrode 15, the drain electrode 16, and the gate electrode 17, an impurity-doped layer (third semiconductor layer) 20, and a gate insulating film 21.

The substrate 11 is made of, for example, material selected from silicon, silicon carbide (SiC), sapphire, gallium nitride (GaN), zinc oxide (ZnO), and gallium arsenide (GaAs) and the like. The buffer layer 12 is made of, for example, $Al_WGa_{1-W}N$ ($0 \leq W \leq 1$). Therefore, the buffer layer 12 includes AlN when W=1, and GaN when W=0. As for the substrate 11 and the buffer layer 12, any material can be selected as long as the element 1 of the present invention can preferably operate.

The carrier transit layer 13 is made of undoped GaN and has a thickness of 1 μm to 5 μm. Alternatively, it may be made of $In_XGa_{1-X}N$ ($0 \leq X \leq 1$). Therefore, the carrier transit layer 13 includes InN when X=1, and GaN when X=0.

The carrier supply layer 14 is made of, for example, $Al_ZGa_{1-Z}N$ ($0<Z \leq 1$) and has a thickness of 10 nm to 100 nm. Here, it is more preferably made of $0.1 \leq Z \leq 0.3$. Alternatively, it may be made of $In_YAl_ZGa_{1-Y-Z}N$ ($0 \leq Y \leq 1$, and $0<Z \leq 1$). A bandgap of the carrier supply layer 14 is wider than a bandgap of the carrier transit layer 13, and the carrier transit layer 13 and the carrier supply layer 14 form a heterojunction. Thus, a two-dimensional carrier gas layer 18 is generated near the heterojunction interface. In the element 1 of the present invention, the two-dimensional carrier gas layer 18 corresponds to a channel.

Each of the source electrode 15, the drain electrode 16, and the gate electrode 17 is made of a metal element such as Ti Al, Cu, Au, Pt, W, Ta, Ru, Ir, Pd, or Hf, an alloy containing at least two of those metal elements, or a nitride containing at least one of those metal elements. Each of the source electrode 15, the drain electrode 16, and the gate electrode 17 may have a single layer structure or a laminated layer structure in which each layer has a different composition. However, each of the source electrode 15 and the drain electrode 16 forms an ohmic junction with the carrier transit layer 13, and when the gate insulating film 21 is not provided, the gate electrode 17 forms a schottky junction with the carrier transit layer 13 and the carrier supply layer 14. When the gate insulating film 21 is provided, the material of the gate electrode 17 is not limited to the above. The gate electrode 17 has a field plate structure, is connected to the carrier supply layer 14 directly or through the gate insulating film 21, and projects on the passivation layer 19 toward the source electrode 15 and the drain electrode 16. In addition, while the gate electrode 17 is arranged between the source electrode 15 and the drain electrode 16, it is located closer to the source electrode 15.

The gate insulating film 21 is made of, for example, an oxide or nitride having a high insulating property, such as $SiO_X$, $AlO_X$, $HfO_X$, $LaO_X$, $ZrO_X$, $YO_X$, SiN, AlN and the like, and formed on a lower surface of the gate electrode 17 when needed.

The impurity-doped layer 20 is formed in a predetermined region on the upper surface of the carrier transit layer 13 to be located under the drain electrode 16. The impurity-doped layer 20 is formed as the semiconductor layer by heavily doping an impurity having the same conductivity type as carriers constituting the two-dimensional carrier gas layer 18. That is, the impurity-doped layer 20 is an n-type semiconductor layer in a case where the carriers constituting the two-dimensional carrier gas layer 18 are electrons, and it is a p-type semiconductor layer in a case where the carriers are holes.

The impurity-doped layer 20 may be made of, for example, $In_UAl_VGa_{1-U-V}N$ ($0 \leq U \leq 1$, and $0 \leq V \leq 1$) doped with the impurity. The doped impurity is not limited as long as it can introduce the carriers in the impurity-doped layer 20, but when the carriers are electrons, it is preferably C, Si, Ge, Sn, Te, O, Se, and the like.

More specifically, in a case where the impurity-doped layer 20 is made of GaN and has a thickness of 100 nm to 10 μm, it preferably contains an element such as C, Si Ge, Sn, Te, O, or Se to the extent that a sheet carrier concentration is $1 \times 10^{12}$ $cm^{-2}$ to $5 \times 10^{14}$ $cm^{-2}$ (to the extent that a volume density is $1 \times 10^{18}$ $cm^{-3}$ to $1.2 \times 10^{22}$ $cm^{-3}$).

According to the element 1 of the present invention, its on state and off state are switched based on a voltage applied state to the gate electrode 17. As illustrated in FIG. 1, in the on state, the two-dimensional carrier gas layer 18 is formed in the heterojunction interface between the carrier transit layer 13 and the carrier supply layer 14, and a conducting state is set between the source electrode 15 and the drain electrode 16 through the two-dimensional carrier gas layer 18 and the impurity-doped layer 20. Meanwhile, as illustrated in FIG. 2, in the off state, when a negative voltage with respect to the source electrode 15 such as −10 V is applied to the gate electrode 17, a depletion layer 22 is formed in the carrier transit layer 13 under the gate electrode 17, and as a result, the two-dimensional carrier gas layer 18 is not formed in the depletion layer 22 in the heterojunction interface between the carrier transit layer 13 and the carrier supply layer 14, so that the connection is cut between the source electrode 15 and the drain electrode 16.

When the element 1 of the present invention is in the off state, a potential of the drain electrode 16 reaches a voltage as high as several hundred volts (such as 600 V). At this time, the carriers in the two-dimensional carrier gas layer 18 are moved into the impurity-doped layer 20, and the carriers in the impurity-doped layer 20 formed under the drain electrode 16 are drawn to an upper portion near the drain electrode 16. However, the two-dimensional carrier gas layer 18 is interrupted in the depletion layer 22 formed by the gate electrode 17, so that the electrons are hardly supplied from the source electrode 15 to the impurity-doped layer 20. Therefore, the impurity-doped layer 20 is divided into an accumulation region 23a having the accumulated carriers in the upper portion, and a depletion region 23b in which the carriers are depleted and high resistance is provided in a lower portion.

As a result, an electric field is applied to the depletion region 23b, so that the electric field near the gate electrode 17 is dispersed, and the element 1 of the present invention is not likely to be destroyed.

Meanwhile, a high voltage is not applied to the element 1 of the present invention in the on state, and the potential of the drain electrode 16 is less likely to rise, so that the carriers in the impurity-doped layer 20 are not accumulated in the upper portion near the drain electrode 16. As a result, the high-resistance depletion region is not generated between the two-dimensional carrier gas layer 18 and the drain electrode 16, and the on resistance of the element 1 of the present invention can be kept low, so that the sufficient amount of drain current can be obtained.

Furthermore, even when the potential of the drain electrode 16 temporarily rises for some reasons in the on state, and the carriers in the impurity-doped layer 20 are drawn near to the drain electrode 16, electrons are supplied from the source electrode 15 to the impurity-doped layer 20 through the two-dimensional carrier gas layer 18, so that the depletion region is not generated in the impurity-doped layer 20.

Thus, since the impurity-doped layer 20 is provided in the element 1 of the present invention, the electric field near the gate electrode 17 can be relaxed in the off state, so that the element destruction can be suppressed over long periods of time.

Furthermore, the element 1 of the present invention is manufactured by the steps of (1) forming the buffer layer 12, the carrier transit layer 13, and the carrier supply layer 14 on the substrate 11 in this order, (2) depositing the passivation layer 19, (3) forming a first opening to expose the carrier transit layer 13 in a predetermined region and forming the impurity-doped layer 20 in the first opening, (4) forming a second opening to expose the carrier transit layer 13, and a third opening to expose the carrier supply layer 14 (or the gate insulating film 21 on the carrier supply layer 14) in predetermined regions, and (5) forming the source electrode 15, the gate electrode 17, and the drain electrode 16 in the second opening, in the third opening, and on the impurity-doped layer 20, respectively. Here, the buffer layer 12, the carrier transit layer 13, the carrier supply layer 14, and the impurity-doped layer 20 can be formed by various film forming methods such as a metal organic chemical vapor deposition (MOCVD) method or molecular beam epitaxy (MBE) method.

Second Embodiment

Figure 3:
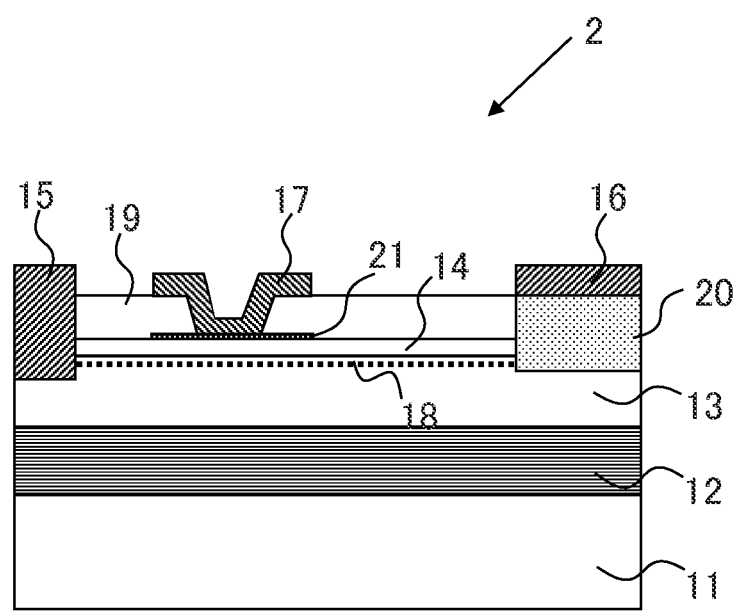
FIG. 3 is a structure cross-sectional view illustrating a configuration of a switching element according to a second embodiment of the present invention.
Figure 4:
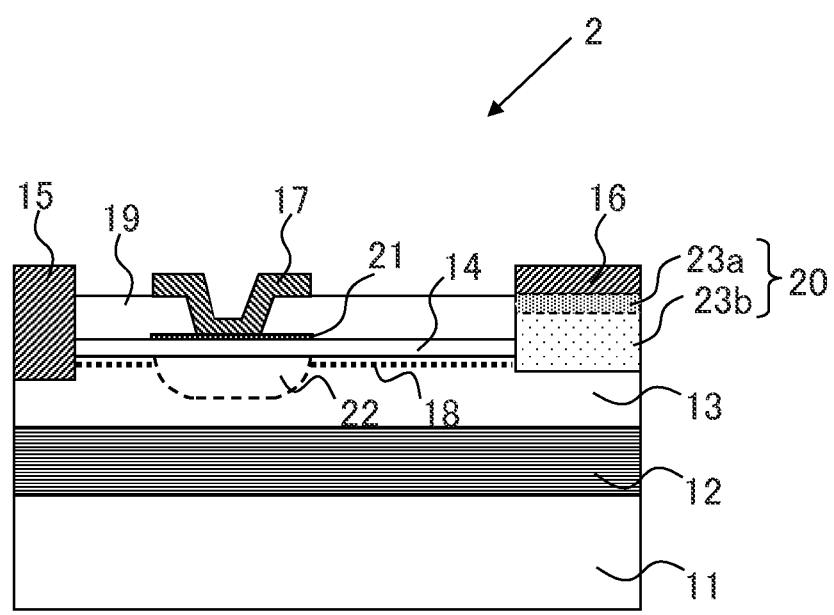
FIG. 4 is a structure cross-sectional view illustrating a configuration of a switching element according to a second embodiment of the present invention.

FIGS. 3 and 4 each illustrate a configuration example of a switching element 2 according to one embodiment of the present invention (hereinafter, referred to as the element 2 of the present invention occasionally). FIGS. 3 and 4 are structure cross-sectional views of the element 2 of the present invention taken from a direction perpendicular to a substrate. FIG. 3 schematically illustrates an on state, and FIG. 4 schematically illustrates an off state of the element 2 of the present invention, respectively.

As illustrated in FIGS. 3 and 4, similar to the element 1 of the present invention in the first embodiment, the element 2 of the present invention includes the substrate 11, the buffer layer 12, the carrier transit layer (first semiconductor layer) 13, the carrier supply layer (second semiconductor layer) 14, the source electrode (first electrode) 15, the drain electrode (second electrode) 16, the gate electrode (control electrode) 17, the passivation layer 19, the impurity-doped layer (third semiconductor layer) 20, and the gate insulating film 21.

According to the element 2 of the present invention, in addition to the configuration of the element 1 of the present invention, a predetermined region in the upper surface of the carrier transit layer 13 on which the drain electrode 16 and the impurity-doped layer 20 are to be formed is recessed by etching or the like. Thus, after the impurity-doped layer 20 has been formed on the recessed portion in the carrier transit layer 13, a side surface of the impurity-doped layer 20 is directly in contact with the two-dimensional carrier gas layer 18. Except for this, the element 2 of the present invention is similar to the element 1 of the present invention illustrated in FIGS. 1 and 2, so that a detailed description about an overlapping part is omitted.

In this configuration, the impurity-doped layer 20 is in contact with the two-dimensional carrier gas layer 18, so that the on resistance in the on state is further kept low, and the sufficient amount of the drain current can be ensured. Furthermore, in the off state, the two-dimensional carrier gas layer 18 is directly in contact with the depletion region 23b in the impurity-doped layer 20, so that the electric field being concentrated near the gate electrode 17 can be partially taken and dispersed thereto.

Third Embodiment

Figure 5:
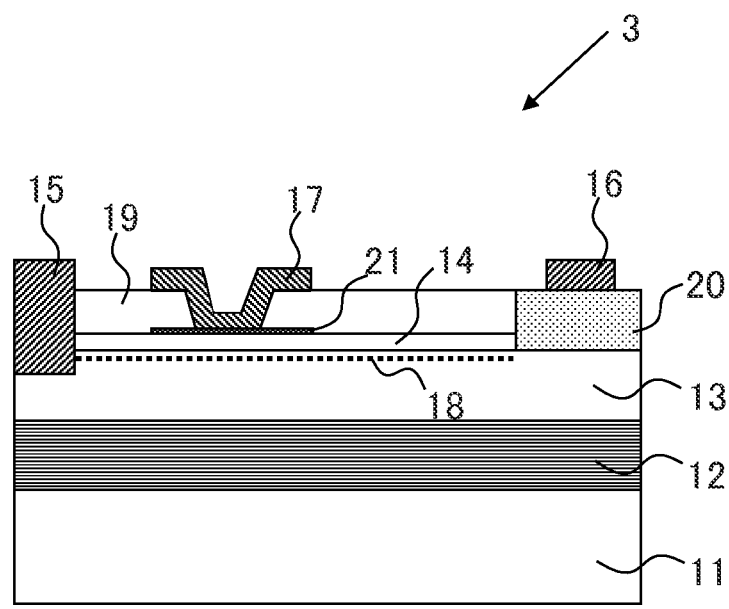
FIG. 5 is a structure cross-sectional view illustrating a configuration of a switching element according to a third embodiment of the present invention.
Figure 6:
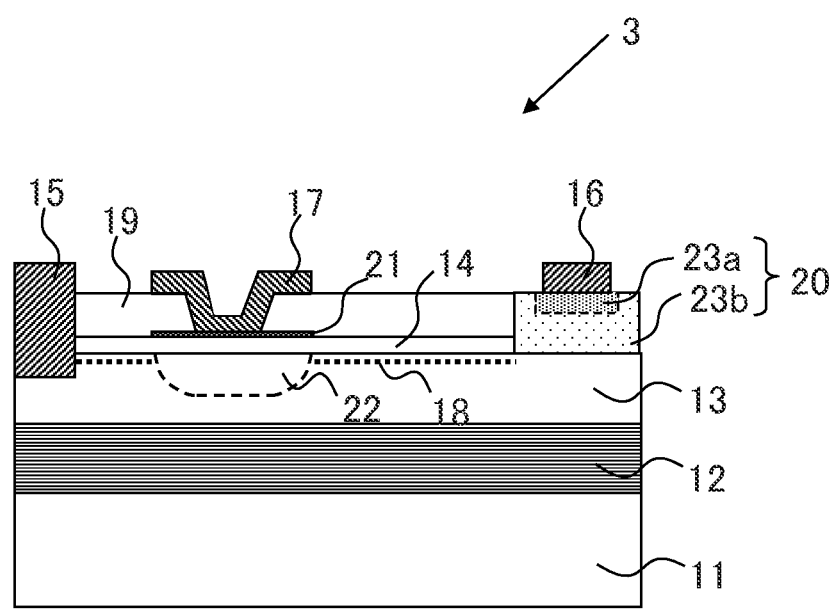
FIG. 6 is a structure cross-sectional view illustrating a configuration of a switching element according to a third embodiment of the present invention.

FIGS. 5 and 6 each illustrate a configuration example of a switching element 3 according to one embodiment of the present invention (hereinafter, referred to as the element 3 of the present invention occasionally). FIGS. 5 and 6 are structure cross-sectional views of the element 3 of the present invention taken from a direction perpendicular to a substrate. FIG. 5 schematically illustrates an on state, and FIG. 6 schematically illustrates an off state of the element 3 of the present invention, respectively.

As illustrated in FIGS. 5 and 6, similar to the element 1 of the present invention in the first embodiment and the element 2 of the present invention in the second embodiment, the element 3 of the present invention includes the substrate 11, the buffer layer 12, the carrier transit layer (first semiconductor layer) 13, the carrier supply layer (second semiconductor layer) 14, the source electrode (first electrode) 15, the drain electrode (second electrode) 16, the gate electrode (control electrode) 17, the passivation layer 19, the impurity-doped layer (third semiconductor layer) 20, and the gate insulating film 21.

According to the element 3 of the present invention, in addition to the configuration of the element 1 of the present invention, the impurity-doped layer 20 is arranged so as to include a projection of the drain electrode 16 located thereon. In other words, the drain electrode 16 is formed on a part of the region of the impurity-doped layer 20 when viewed from a direction perpendicular to the surface of the substrate 11. Except for this, the element 3 of the present invention is similar to the element 1 illustrated in FIGS. 1 and 2, so that a detailed description for an overlapping portion is omitted.

In this configuration, the high-resistance depletion region 23b generated in the impurity-doped layer 20 in the off state is also spread in the impurity-doped layer 20 in a direction parallel to the substrate, so that a leakage current through the carrier supply layer 14, the passivation layer 19, and the two-dimensional carrier gas layer 18 can be suppressed.

Fourth Embodiment

Figure 7:
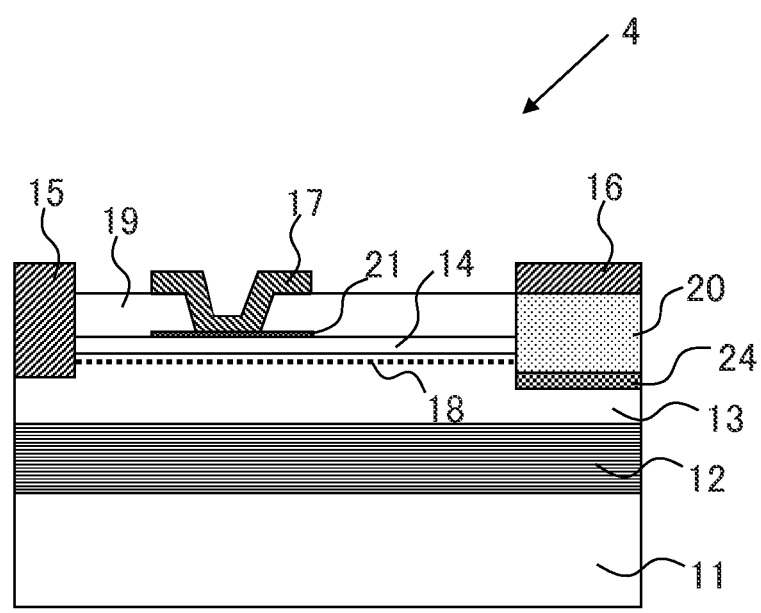
FIG. 7 is a structure cross-sectional view illustrating a configuration of a switching element according to a fourth embodiment of the present invention.
Figure 8:
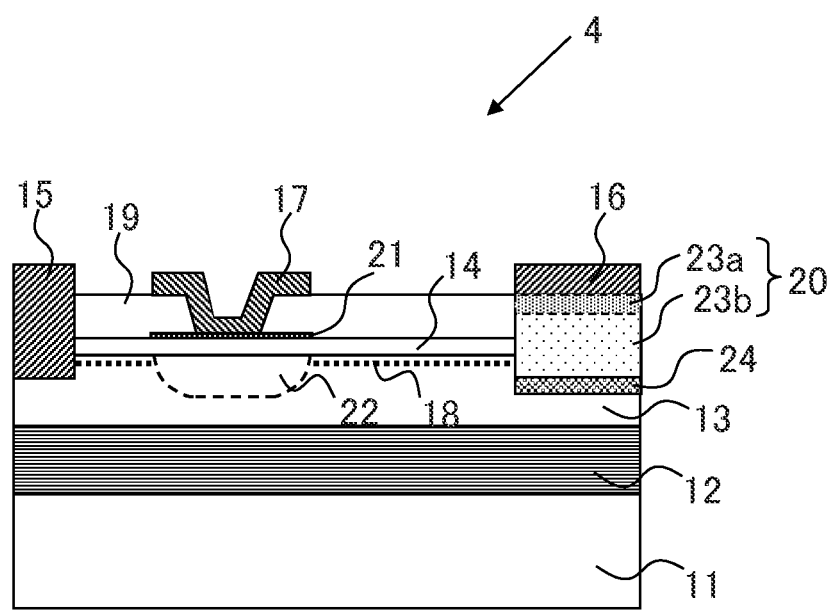
FIG. 8 is a structure cross-sectional view illustrating a configuration of a switching element according to a fourth embodiment of the present invention.

FIGS. 7 and 8 each illustrate a configuration example of a switching element 4 according to one embodiment of the present invention (hereinafter, referred to as the element 4 of the present invention occasionally). FIGS. 7 and 8 are structure cross-sectional views of the element 4 of the present invention taken from a direction perpendicular to a substrate. FIG. 7 schematically illustrates an on state, and FIG. 8 schematically illustrates an off state of the element 4 of the present invention, respectively.

As illustrated in FIGS. 7 and 8, similar to the element 1 of the present invention in the first embodiment, the element 2 of the present invention in the second embodiment, and the element 3 of the present invention in the third embodiment, the element 4 of the present invention includes the substrate 11, the buffer layer 12, the carrier transit layer (first semiconductor layer) 13, the carrier supply layer (second semiconductor layer) 14, the source electrode (first electrode) 15, the drain electrode (second electrode) 16, the gate electrode (control electrode) 17, the passivation layer 19, the impurity-doped layer (third semiconductor layer) 20, and the gate insulating film 21.

According to the element 4 of the present invention, in addition to the configuration of the element 2 of the present invention, a barrier layer (fourth semiconductor layer) 24 having a bandgap wider than that of the carrier transit layer 13 is provided between a lower surface of the impurity-doped layer 20 and an upper surface of the carrier transit layer 13. Except for this, it is similar to the elements 2 of the present invention illustrated in FIGS. 3 and 4, so that a detailed description for an overlapping portion is omitted.

The barrier layer 24 may be made of, for example, $In_SAl_TGa_{1-S-T}N$ ($0≤S≤1$, and $0<T≤1$) when the carrier transit layer 13 is made of $In_XGa_{1-X}N$ ($0≤X≤1$).

In this configuration, due to the barrier layer 24, the leakage current is suppressed between the drain electrode 16 and the carrier transit layer 13. As a result, supply of the carriers from the carrier transit layer 13 to the impurity-doped layer 20 can be suppressed in the off state, so that even when the drain electrode 16 is relatively small, the depletion of impurity-doped layer 20 is progressed, and the high-resistance depletion region 23b is generated, so that the electric field of the gate electrode 17 is readily to be relaxed.

As described above, according to the switching elements (elements 1 to 4 of the present invention) in the above embodiments of the present invention, the impurity-doped layer 20 is provided between the carrier transit layer 13 (first semiconductor layer) and the drain electrode 16, so that the switching element is not likely to be destroyed even when the high voltage is applied to the element in the off state, and can obtain the sufficient amount of the drain current in the on state.

Other Embodiments

Hereinafter, other embodiments will be described.

<1> According to the first to fourth embodiments, the carriers constituting the two-dimensional carrier gas layer 18 are electrons, but the present invention is not limited to this, and even when the carriers constituting the two-dimensional carrier gas layer 18 are holes, the present invention can be applied. However, as for the nitride semiconductor, the mobility of the electron is greater than that of the hole, so that the present invention is preferable when the carriers constituting the two-dimensional carrier gas layer 18 are electrons.

<2> In addition, it is assumed that each of the elements 1 to 4 of the present invention is a normally-on switching element in the above embodiments, but the present invention is not limited to this, and the present invention may be applied to a normally-off switching element.

Figure 9:
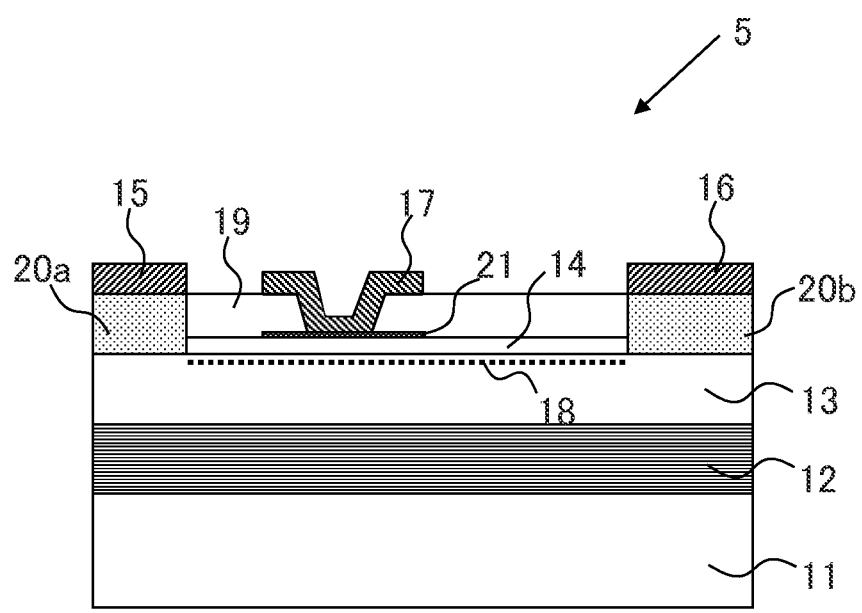
FIG. 9 is a structure cross-sectional view illustrating a configuration of a switching element according to another embodiment of the present invention.
Figure 10:
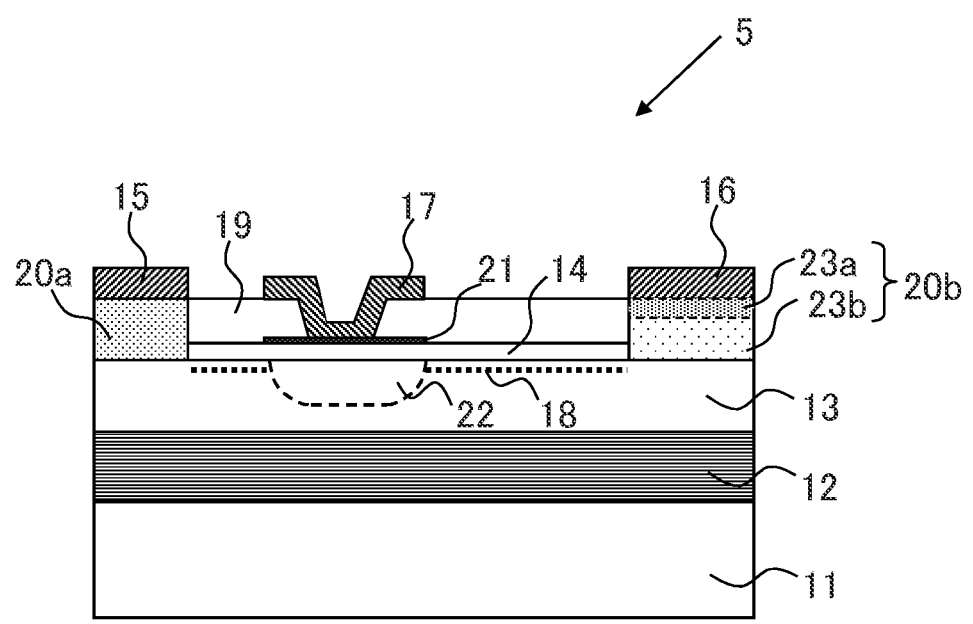
FIG. 10 is a structure cross-sectional view illustrating a configuration of a switching element according to another embodiment of the present invention.
Figure 11:
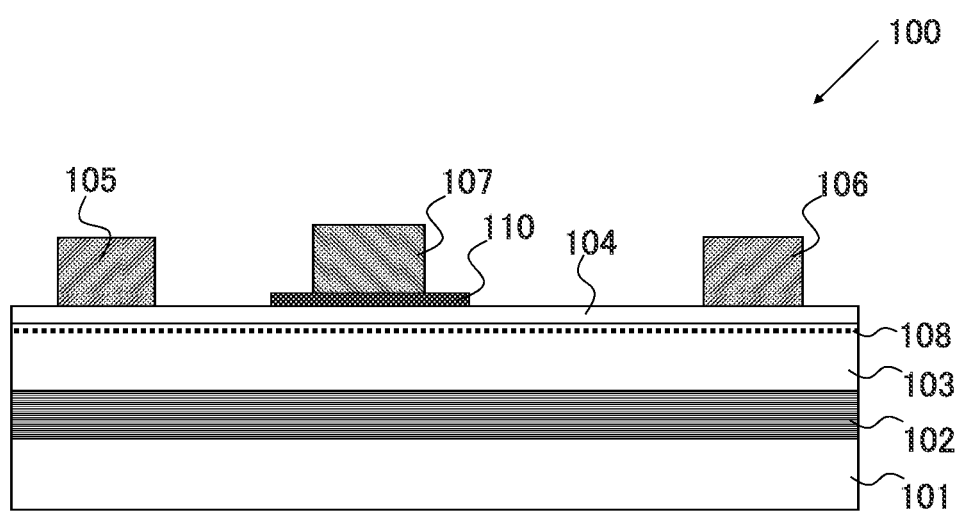
FIG. 11 is a structure cross-sectional view illustrating a configuration of a conventional switching element.
Figure 12:
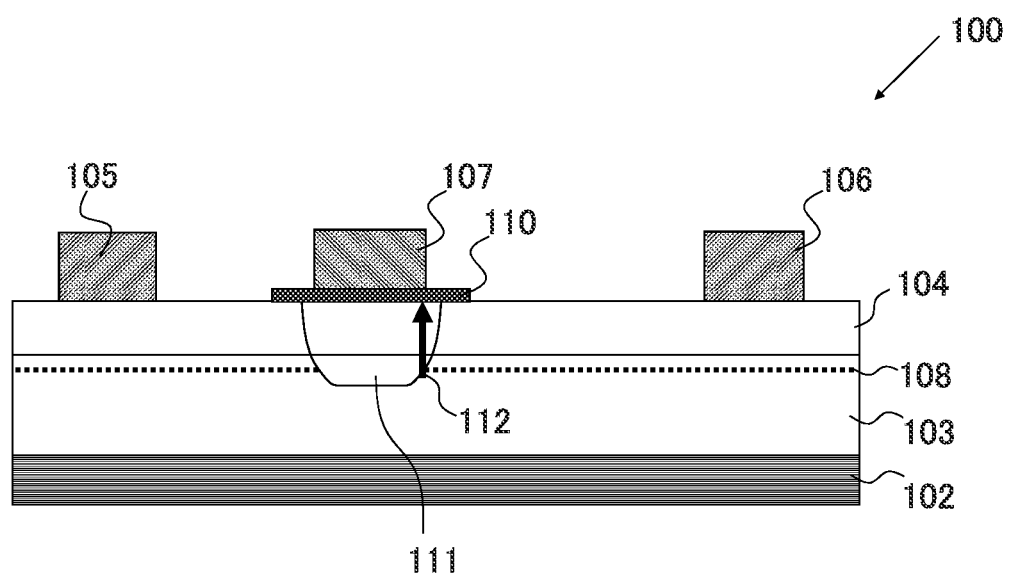
FIG. 12 is a schematic view for describing a problem in an off state in the conventional switching element.
Figure 13:
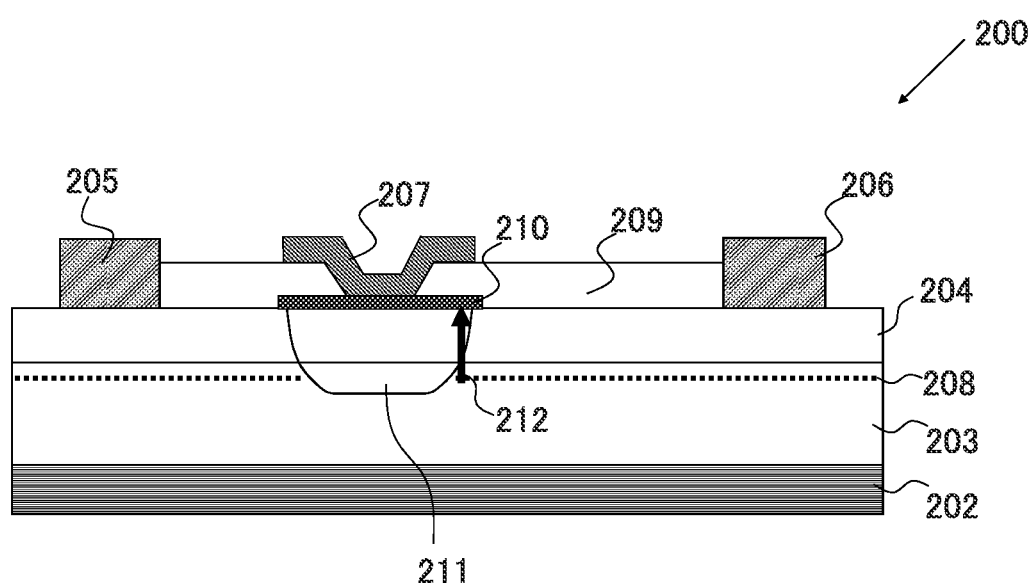
FIG. 13 is a structure cross-sectional view illustrating a configuration of a conventional switching element employing a field plate structure for the gate electrode.

<3> Each of the elements 1 to 4 of the present invention includes the impurity-doped layer 20 between the drain electrode 16 and the carrier transit layer 13 in the above embodiments, but the impurity-doped layer 20 may be also provided between the source electrode 15 and the carrier transit layer 13. According to a switching element of the present invention illustrated in FIGS. 9 and 10 (hereinafter, referred to as the element 5 of the present invention occasionally), the impurity-doped layer 20 (20a) is additionally provided between the source electrode 15 and the carrier transit layer 13 in the element 1 of the present invention. FIG. 9 schematically illustrates an on state, and FIG. 10 schematically illustrates an off state of the element 5 of the present invention, respectively. The impurity-doped layer 20 includes the impurity-doped layer 20a formed between the source electrode 15 and the carrier transit layer 13, and an impurity-doped layer 20b formed between the drain electrode 16 and the carrier transit layer 13, each formed in separation to each other.

In the configuration of the element 5 of the present invention also, similar to the elements 1 to 4 of the present invention, the high-resistance depletion region 23b in which the carriers are depleted is formed in the impurity-doped layer 20b connected to the drain electrode 16, so that the switching element is not likely to be destroyed even when the high voltage is applied to the element in the off state, and can obtain the sufficient amount of the drain current in the on state.

Furthermore, according to a manufacturing process of the element 5 of the present invention, since the impurity-doped layer 20 (20a and 20b), and the source electrode 15, and the drain electrode 16 can be formed with the same mask, the mask for forming the impurity-doped layer 20 is not needed, so that the switching element that can obtain the large amount of the drain current with the high withstanding voltage can be manufactured at low cost.

INDUSTRIAL APPLICABILITY

The present invention is applicable to the switching element, and in particular, preferably applicable to the switching element used as the power device.

DESCRIPTION OF SYMBOLS 1 to 4 Switching element according to the present invention (element of the present invention)
11, 101, 201 Substrate
12, 102, 202 Buffer layer
13, 103, 203 Carrier transit layer (first semiconductor layer)
14, 104, 204 Carrier supply layer (second semiconductor layer)
15, 105, 205 Source electrode (first electrode)
16, 106, 206 Drain electrode (second electrode)
17, 107, 207 Gate electrode (control electrode)
18, 108, 208 Two-dimensional carrier gas layer
19, 209 Passivation layer (insulating layer)
20, 20a, 20b Impurity-doped layer (third semiconductor layer)
23a Accumulated region
23b Depletion region
21, 110, 210 Gate insulating film
22, 111, 211 Depletion region
24 Barrier layer (fourth semiconductor layer)
100, 200 Conventional switching element
112, 212 Electric field

The invention claimed is:
1. A switching element comprising:
a first semiconductor layer;
a second semiconductor layer formed on an upper surface of the first semiconductor layer, having a wider bandgap than the first semiconductor layer, and forming a heterojunction with the first semiconductor layer;
a first electrode electrically connected to the first semiconductor layer;
a second electrode electrically connected to the first semiconductor layer, and formed to be away from the first electrode in a direction parallel to a surface of the first semiconductor layer; and
a control electrode formed on an upper layer of the second semiconductor layer to be located between the first electrode and the second electrode when viewed from a direction perpendicular to the surface, wherein
the switching element switches its state, according to a potential of the control electrode, between an on state to electrically connect the first electrode to the second electrode through a two-dimensional carrier gas layer generated in a junction interface between the first semiconductor layer and the second semiconductor layer, and an off state to cut off an electrical connection between the first electrode and the second electrode because the two-dimensional carrier gas layer is not generated at least in the junction interface between the first semiconductor layer and the second semiconductor layer under the control electrode,
a third semiconductor layer is formed in a predetermined first region on or above the upper surface of the first semiconductor layer by doping an impurity having the same conductivity type as a carrier constituting the two-dimensional carrier gas layer, the second electrode is electrically connected to the first semiconductor layer through the third semiconductor layer, the third semiconductor layer is formed on a recessed portion of the first semiconductor layer, a side surface of the third semiconductor layer is in contact with the two-dimensional carrier gas layer, and a fourth semiconductor layer having a wider bandgap than the first semiconductor layer is provided between a lower surface of the third semiconductor layer and the upper surface of the first semiconductor layer.

2. The switching element according to claim 1, wherein when a voltage is applied between the second electrode and the first electrode in the off state, majority carriers in the third semiconductor layer move toward an interface with the second electrode so that majority carriers near an interface with the first semiconductor layer are depleted, and a high-resistance region is formed in the third semiconductor layer.

3. The switching element according to claim 1, wherein the third semiconductor layer is formed in a second region provided away from the first region on or above the upper surface of the first semiconductor layer to be provided separately from the third semiconductor layer formed in the first region, and the first electrode is electrically connected to the first semiconductor layer through the third semiconductor layer formed on the second region.

4. The switching element according to claim 1, wherein the second electrode is formed on a part of a region of the third semiconductor layer when viewed from the direction perpendicular to the surface.

\* \* \* \* \*